(12) United States Patent
Chen et al.

(10) Patent No.: US 8,293,460 B2
(45) Date of Patent: Oct. 23, 2012

(54) DOUBLE EXPOSURE PATTERNING WITH CARBONACEOUS HARDMASK

(75) Inventors: Hui W. Chen, San Jose, CA (US); Chorng-Ping Chang, Saratoga, CA (US); Yongmei Chen, San Jose, CA (US); Huixiong Dai, San Jose, CA (US); Jiahua Yu, Milpitas, CA (US); Susie X. Yang, Sunnyvale, CA (US); Xumou Xu, Campbell, CA (US); Christopher D. Bencher, San Jose, CA (US); Raymond Hoiman Hung, Cupertino, CA (US); Michael P. Duane, Santa Clara, CA (US); Christopher Siu Wing Ngai, Burlingame, CA (US); Jen Shu, Saratoga, CA (US); Kenneth MacWilliams, Los Altos Hills, CA (US)

(73) Assignee: Applied Materials, Inc., Santa Clara, CA (US)

( * ) Notice: Subject to any disclaimer, the term of this patent is extended or adjusted under 35 U.S.C. 154(b) by 834 days.

(21) Appl. No.: 12/339,836

(22) Filed: Dec. 19, 2008

(65) Prior Publication Data
US 2009/0311635 A1    Dec. 17, 2009

Related U.S. Application Data

(60) Provisional application No. 61/061,961, filed on Jun. 16, 2008.

(51) Int. Cl.
*G03F 7/20* (2006.01)
(52) U.S. Cl. .......................... 430/323; 430/394
(58) Field of Classification Search .................. 430/394, 430/323
See application file for complete search history.

(56) References Cited

U.S. PATENT DOCUMENTS

| | | | |
|---|---|---|---|
| 7,378,289 B1 * | 5/2008 | Ma et al. .......................... 438/14 |
| 2002/0182549 A1 * | 12/2002 | Chang et al. ................... 430/394 |
| 2003/0003401 A1 | 1/2003 | Wiltshire |
| 2005/0046816 A1 | 3/2005 | Lin |
| 2005/0167394 A1 | 8/2005 | Lui et al. |
| 2005/0287483 A1 | 12/2005 | Lercel et al. |
| 2006/0113577 A1 | 6/2006 | Ohtani |
| 2006/0228854 A1 * | 10/2006 | Tran et al. ...................... 438/238 |
| 2006/0228895 A1 | 10/2006 | Chae et al. |
| 2006/0292876 A1 * | 12/2006 | Naito ............................ 438/689 |
| 2007/0003878 A1 * | 1/2007 | Paxton et al. .................. 430/311 |
| 2007/0054198 A1 | 3/2007 | Park |
| 2007/0161251 A1 * | 7/2007 | Tran et al. ...................... 438/725 |
| 2007/0212648 A1 | 9/2007 | Lalbahadoersing et al. |
| 2007/0212649 A1 | 9/2007 | Lalbahadoersing et al. |
| 2007/0279606 A1 | 12/2007 | Nagasaka |
| 2007/0298353 A1 | 12/2007 | Yamamoto et al. |
| 2008/0003705 A1 | 1/2008 | Cho et al. |
| 2008/0009137 A1 | 1/2008 | Kong |
| 2008/0009138 A1 | 1/2008 | Lee |
| 2009/0087979 A1 * | 4/2009 | Raghuram et al. ............ 438/620 |

* cited by examiner

*Primary Examiner* — Brittany Raymond
(74) *Attorney, Agent, or Firm* — Blakely, Sokoloff, Taylor & Zafman (57) ABSTRACT

Methods to pattern features in a substrate layer by exposing a photoresist layer more than once. In one embodiment, a single reticle may be exposed more than once with an overlay offset implemented between successive exposures to reduce the half pitch of the reticle. In particular embodiments, these methods may be employed to reduce the half pitch of the features printed with 65 nm generation lithography equipment to achieve 45 nm lithography generation CD and pitch performance.

8 Claims, 9 Drawing Sheets

DOUBLE EXPOSURE PATTERNING WITH CARBONACEOUS HARDMASK

CROSS REFERENCE TO RELATED APPLICATIONS

This application claims the benefit of U.S. provisional application Ser. No. 61/061,961 filed Jun. 16, 2008, entitled DOUBLE EXPOSURE PATTERNING WITH CARBONACEOUS HARDMASK.

BACKGROUND

1. Field

Embodiments of the present invention relate to the electronics manufacturing industry and more particularly to a patterning process enabling a reduced half pitch.

2. Discussion of Related Art

Figure 1A:
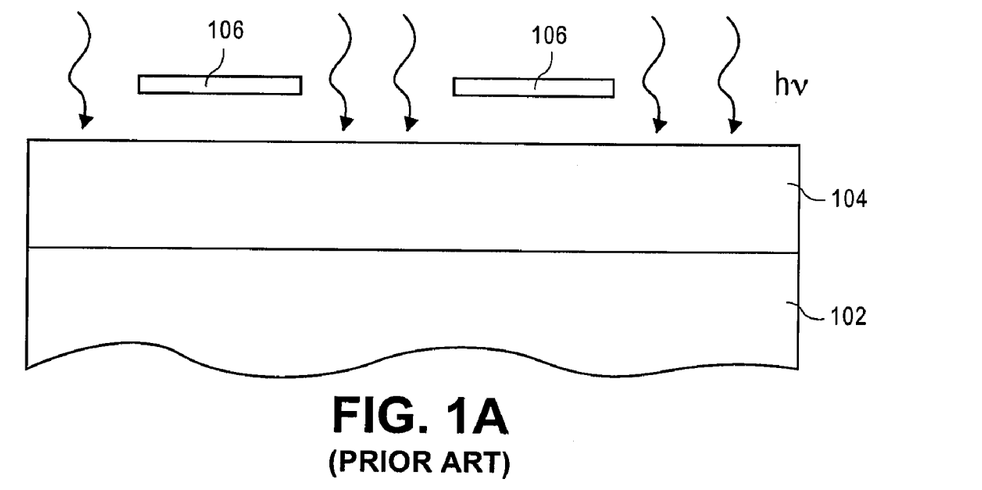
FIG. 1A-1C illustrate a conventional means of biasing a feature to reduce critical dimensions.
Figure 1B:
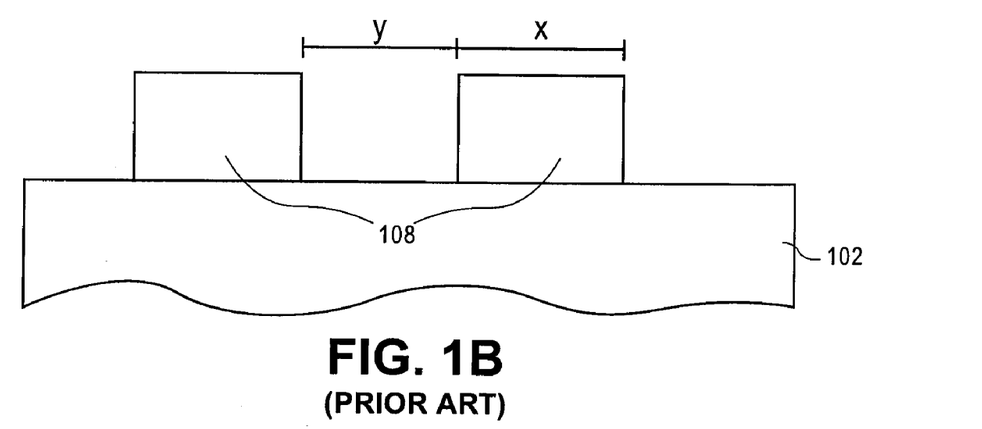
Figure 1C:
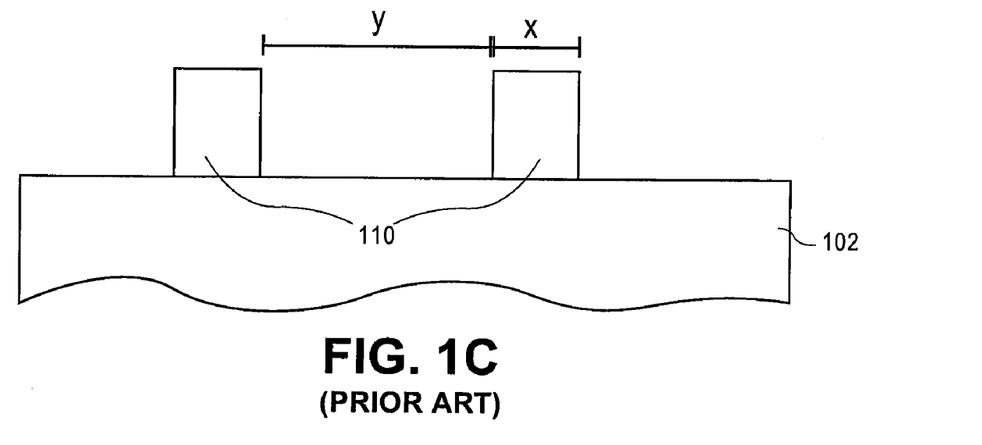

Lithography is used in the manufacture of integrated circuits (ICs). FIGS. 1A-1C illustrate cross-sectional views of a conventional semiconductor lithographic process. Referring to FIG. 1A, a photoresist layer 104 is provided above a semiconductor stack 102. A mask or reticle 106 is positioned above photoresist layer 104. A lithographic process includes exposure of photoresist layer 104 to radiation (hv) having a particular wavelength ($\lambda$), as indicated by the arrows in FIG. 1A. Referring to FIG. 1B, photoresist layer 104 is subsequently developed to remove the portions photoresist layer 104 that were exposed to light and thereby provide patterned photoresist layer 108 above semiconductor stack 102. The width of each feature of patterned photoresist layer 108 is depicted by the width 'x' of a feature and the space 'y' between each feature. The width 'x' added to space 'y' is referred to as the pitch, p.

Referring to FIG. 1C, the CD, or width 'x,' of a feature may be reduced to form patterned photoresist layer 110 above semiconductor stack 102. The CD may be shrunk, or "biased" by over-exposing photoresist layer 104 during the lithographic step depicted in FIG. 1A or by trimming patterned photoresist layer 108 provided in FIG. 1B with an isotropic etch process prior to etching semiconductor stack 102. However, such a reduction in feature CD comes at the expense of an increased spacing between features, as depicted by spacing 'y' in FIG. 1C. That is, there is a trade-off between the smallest dimension of the features in patterned photoresist layer 110 and the spacing between these features, thereby making pitch a constant when feature biasing is employed.

Since biasing a pattern to reduce feature dimensions does not reduce pitch, the critical path for further IC scaling lies with the resolution of the lithographic process. The resolution limit for a particular lithographic process is characterized with features having a critical dimension (CD) equal to the space between the features, i.e. x=y, as depicted in FIG. 1B, with both x and y being equal to the "half pitch." For example, a particular conventional 193 nm lithography system provides a minimum pitch, p, of 130 nm and a 65 nm half pitch.

Generally, the minimum half pitch may be derived from the Rayleigh resolution equation and is a function of the numerical aperture (NA) of the imaging system, the wavelength ($\lambda$) of the imaging light. Thus, some strategies to advance lithography are based on high NA lithography, such as "hyper-NA" immersion lithography wherein an NA of about 1.3 can be achieved by immersing the imaging optics in water. Still other strategies to advance lithography employ shorter wavelengths, such as extreme ultra-violet (EUV). Progress on these fronts, however, has been slow, hindered by the substantial development and re-tooling required.

As a result, the need to reach the 45 nm half pitch node and even 32 nm half pitch node in state of the art IC fabrication has arrived before availability of production-worthy lithography systems employing either high refractive index or EUV technology. Density-sensitive product lines, such as flash memory and dynamic random access memory (DRAM) are therefore pursuing double patterning lithography (DPL) as a third strategy to reduce the effective half pitch of patterns formed in a substrate. Generally, the DPL technique successively patterns a substrate twice, each patterning operation performed with a different mask and a relaxed half pitch. The two resulting patterns interlace to compose features on the substrate having a half pitch smaller than that of either individual pattern. The composition of the two patterns is then transferred into the substrate to define a pattern in the substrate having a half pitch below that lithographically achievable with the particular lithography employed, i.e. "sub-minimum half pitch."

Because the DPL method is relatively independent of the lithographic technology employed, it can be practiced with existing 193 nm lithography as well as next generation high NA or EUV lithography to provide a sub-minimum half pitch. Thus, DPL will, sooner or later, likely become a fixture in the industry as a means to extend the capabilities of each lithography generation. DPL however is potentially cost prohibitive, particularly as a result of production cycle time, which increases because multiple photomasks, multiple resist coats and multiple etches are required to form pattern in a single layer. DPL also incurs an overlay penalty because of the plurality of masking operations. Thus, methods to reduce feature pitch without incurring such a large overhead are advantageous.

SUMMARY

Multiple exposures of a layer of photoresist are described herein. In one embodiment described, a single reticle may be exposed more than once with an overlay offset implemented between successive exposures to reduce the half pitch of the reticle. In particular embodiments, these methods may be employed to reduce the half pitch of the features printed with 65 nm generation lithography equipment to achieve 45 nm CD and pitch performance.

In certain embodiments of the present invention, the reduced half pitch features are patterned into a carbonaceous mask layer to reduce line edge roughness (LER). LER becomes a significant issue when a lithography tool is pushed to image features with minimum CD. The carbonaceous mask layer provides a mechanically stable mask material capable of delineating features with nanometer CD and half pitch. In one embodiment, the carbonaceous mask layer is a CVD carbon layer resistant to subsequent processing at high temperature, e.g. greater than approximately 250° C.

In an embodiment, a first photoresist exposure is performed with the lithography equipment optimized for a reduced feature size at a relaxed half pitch. With the half pitch relaxed, a first feature (e.g. a first space) of minimum CD for the lithography generation may be achieved. The minimum feature CD is achieved at the expense of a greater than minimum half pitch. Then, a second exposure of the same reticle is performed after an alignment offset is entered into the lithography equipment. This second exposure prints a second feature (e.g. a second space), also of minimum CD. Because the alignment offset was entered, the second feature of minimum CD is offset from the first feature, causing the relaxed half pitch features to interlace and form minimum CD features at a reduced half pitch.

One embodiment provides a method of exposing a photoresist over a substrate layer with a reticle to form a first pair of photoresist lines with a first space there between, the first pair of photoresist lines having a first alignment relative to the substrate layer. The method proceeds to offset, with the lithography equipment, the first alignment between the reticle and the substrate layer to have a second alignment and then re-expose the photoresist with the reticle a second time to bifurcate at least one of the first pair of photoresist lines with a second space to form a pitch-reduced, CD reduced double pattern comprising at least two photoresist lines and two spaces. This pitch-reduced, CD reduced double pattern is then etched into the substrate layer. In a particular embodiment, the space has a CD of X and each of the first pair of photoresist lines has a CD of approximately 3×. Re-exposing the photoresist then forms a double pattern of lines with a CD of approximately X and spaces with a CD of approximately X.

In still another embodiment, where the space has a CD of X and each of the first pair of lines has a CD of more than X, but less than about 3×, a substrate layer is covered with a bottom anti-reflective coating (BARC) and a photoresist over the BARC. The photoresist is exposed with a reticle having a first alignment relative to the substrate layer to form a first pair of photoresist lines with a first space there between. Each line of the pair has a first CD that is, for example, between two and three times that of a second CD of the space. The method proceeds by offsetting the first alignment between the reticle and the substrate layer to a second alignment and re-exposing the photoresist with the reticle to bifurcate one of the first pair of photoresist lines with a second space to form a double pattern comprising at least two photoresist lines and two spaces, wherein each of the two photoresist lines has a third CD that is smaller than the second CD of the spaces. The BARC is then etched with a polymerizing plasma etch process to form at least two BARC lines and two spaces, wherein the BARC lines and spaces are approximately equal to a fourth CD, smaller than the second CD but larger than the third CD. The substrate layer is then etched to form a double pattern comprising at least two lines and two spaces, wherein the CD of the lines and spaces are approximately equal to the fourth CD.

BRIEF DESCRIPTION OF THE DRAWINGS

Embodiments of the present invention are illustrated by way of example, and not limitation, in the figures of the accompanying drawings in which.

DETAILED DESCRIPTION

Double exposure methods are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present invention. In other instances, well-known semiconductor processes and manufacturing techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention and such references mean "at least one." Furthermore, the particular features, structures, materials, or characteristics may be combined in any suitable manner in one or more embodiments.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Figure 2:
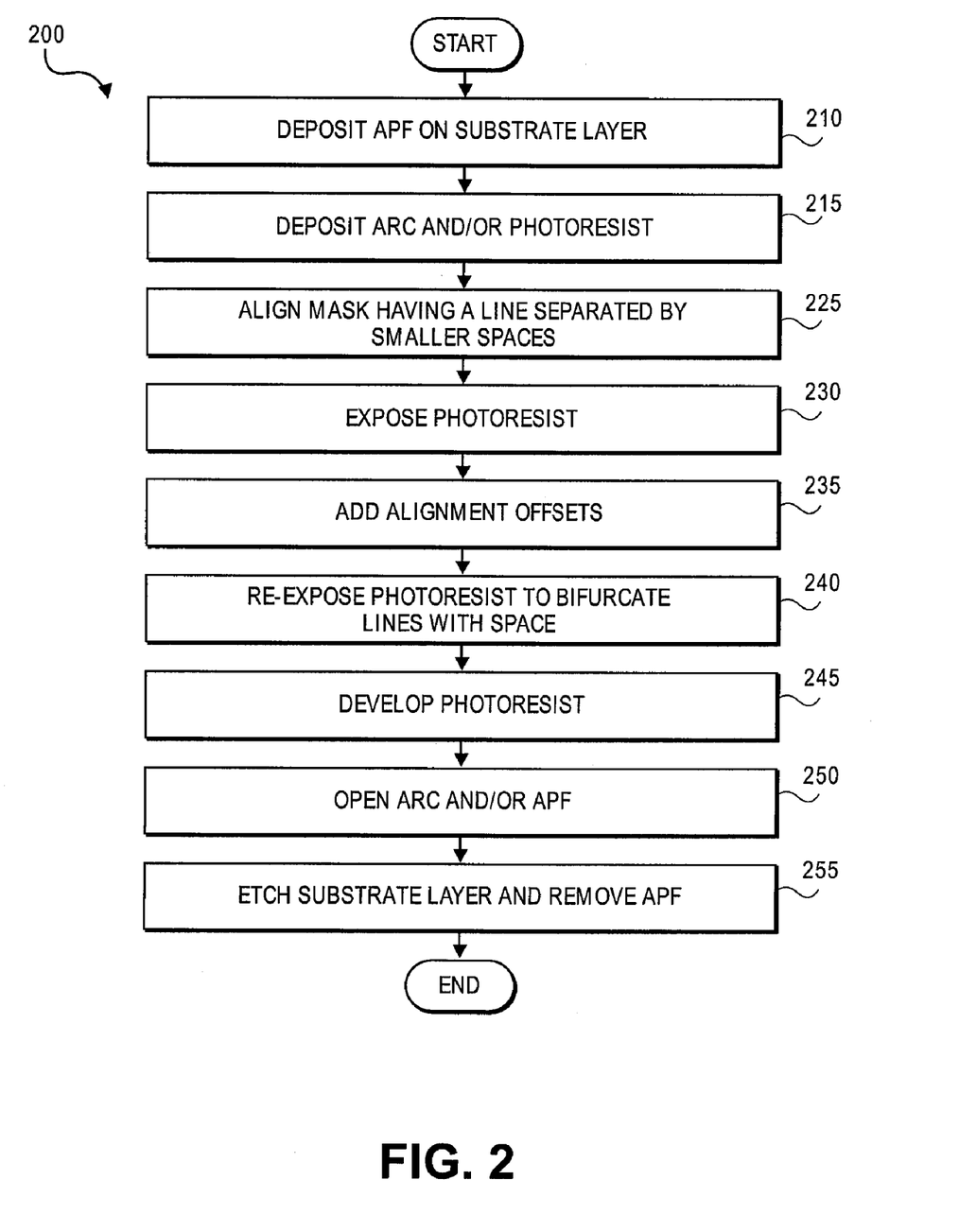
FIG. 2 illustrates a flow chart of a double exposure method for etching a double pattern in a substrate layer, in accordance with a particular embodiment of the present invention.

FIG. 2 illustrates a flow chart of double exposure method 200 for using a single reticle to form a double pattern in a photoresist layer and any number of intermediate layers, such as a carbonaceous mask layer, and then transferring that pattern into a substrate layer. FIGS. 3-11 illustrate cross-sectional views of a particular double exposure embodiment wherein each exposure of a reticle forming spaces with a CD of X and photoresist lines with a CD of approximately 3X are interlaced into a double pattern with reduced pitch and reduced line CD.

Referring to FIG. 2, a carbonaceous mask layer is first deposited at operation 210, then a photoresist layer and any intermediate layers, such as a dielectric anti-reflective coating (DARC) or bottom anti-reflective coating (BARC), is deposited on the carbonaceous mask layer at operation 215. After forming the multi-layered mask, the multi-layered mask is then patterned. A reticle is first aligned to the substrate layer at operation 225. With this first alignment, the photoresist is exposed a first time at operation 230 to form a first pair of photoresist lines with a space there between. In the depicted embodiment, the space is of a smaller CD than that of each of the pair of lines. Following the exposure of operation 230, alignment offsets are input into the lithography equipment to offset the alignment between the substrate layer and the reticle by a known amount at operation 235. Following input of alignment offsets, the photoresist is exposed a second time at operation 240 to bifurcate with a space at least one of the photoresist lines printed in the photoresist with the first exposure. The twice-exposed photoresist is then developed at operation 245. With a double pattern formed in the photoresist layer, the carbonaceous mask layer, as well as any other non-photo-sensitive intermediate layers, are then patterned at operation 250. Substantially completing method 200, the substrate layer is etched at operation 255 to have the pitch-reduced, CD reduced double pattern. As a further illustration of double patterning method 200, specific embodiments are discussed below in greater detail with reference to the remaining figures.

Figure 3:
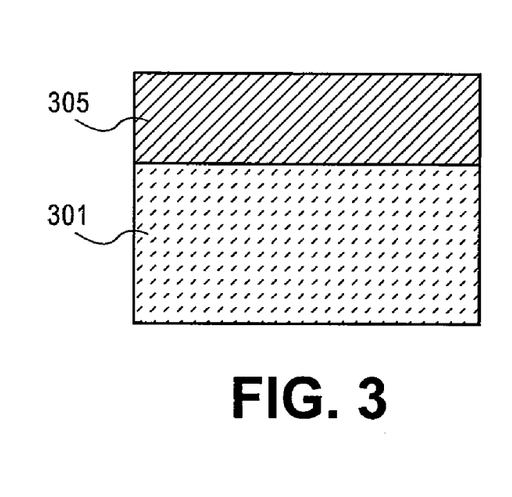
FIGS. 3, 4, 5, 6, 7A, 8A, 9, 10 and 11 illustrate cross sectional views of a workpiece during representative operations of a double exposure method for etching a double pattern in a substrate layer, in accordance with one embodiment of the present invention.

Referring to FIG. 3, the substrate layer 305 generally comprises the layer in which feature is ultimately desired and is provided on a supporting substrate 301. In one embodiment, the supporting substrate 301 is a semiconductor wafer, such as, but not limited to silicon, germanium, or a commonly known III-V compound semiconductor material. In another embodiment, the supporting substrate 301 is a glass, such as used in the manufacture of thin film transistors for displays. In still other embodiments, the supporting substrate 301 is quartz, sapphire or other insulative material. Substrate layer 305 is distinguished from a mask layer in that a mask layer is a temporary layer employed to transfer a lithographically defined pattern into the substrate layer 305.

Substrate layer 305 may itself form sacrificial structures which do not become permanent features of the fabricated device, however in a particular embodiment the features etched into substrate layer 305 are permanent. In an exemplary embodiment, substrate layer 305 is a conductor for a transistor electrode, such as doped polysilicon or commonly employed metals like aluminum, tantalum, titanium, tungsten, cobalt, nickel and their nitrides. For one particular embodiment, the substrate layer 305 is a doped polysilicon formed to a thickness of between 75 nm and 120 nm with a process that is between 300° C. and 450° C. Low temperature growth processes below 500° C. are advantageous because grain size, which effects line edge roughness (LER), can be reduced.

In an alternate embodiment, the substrate layer 305 is a dielectric, such as a nitride layer, a silicon dioxide layer, or a layer of a commonly known low-k material (i.e. material with a k lower than silicon dioxide), such as carbon doped oxide. In still another embodiment, substrate layer 305 comprises a semiconductor, such as lightly doped silicon, germanium or other commonly known material. In yet another embodiment, the substrate layer may further comprise multiple layers of dielectric and/or semiconductor and/or conductor materials, as commonly known in the art.

Figure 4:
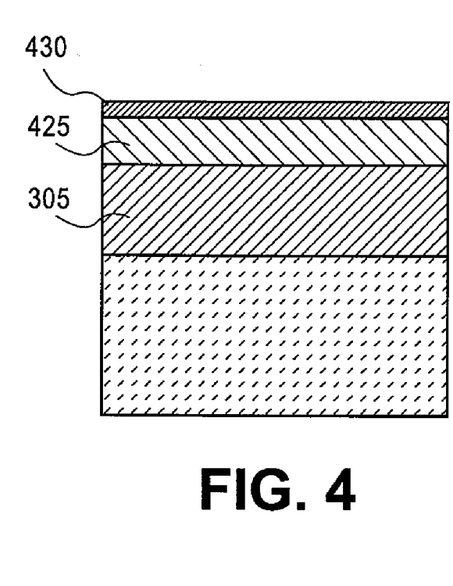

In the depicted embodiment, carbonaceous mask layer 425 of FIG. 4 is formed upon substrate layer 305 as the first layer of a multi-layered mask. As used herein, "carbonaceous" refers to a material having more than 50 atomic % carbon. Carbonaceous mask layer 425 is not photosensitive and instead is defined with an etch to reproduce the pattern of an overlying photosensitive layer. Carbonaceous mask layer 425 is advantageous because it can be readily etched with high selectivity to the substrate layer 305. Carbonaceous mask layer 425 is also advantageous because, when etched, can reduce the LER relative to that of a lithographically defined photoresist line. Carbonaceous mask layer 425 may also be advantageously removed with the same methods used to remove a photosensitive layer, for example, with a plasma comprising an oxidizing agent and/or a reducing agent. Because no additional mask removal operations are required, process complexity is reduced relative to the traditional hard mask process.

In one particular embodiment, carbonaceous mask layer 425 is CVD carbon. CVD carbon comprises carbon formed by a chemical vapor deposition (CVD), which may be thermal process or a plasma enhanced process (PECVD). Generally, the CVD carbon material comprises carbon with sp1, sp2 and sp3 bonding states giving the film properties which are a hybrid of those typical of pyrolylic, graphitic, and diamond-like carbon. Because the CVD carbon material may contain a plurality of bonding states in various proportions, it lacks long rang order and so is commonly referred to as "amorphous carbon." An amorphous carbon material is commercially available from Applied Materials, Inc., CA, U.S.A. under the trade name Advanced Patterning Film™ (APF).

The carbonaceous mask layer 425 is formed with a thickness dependent on the material's resistance to the process used to pattern substrate layer 305 and the structural integrity of the carbonaceous material (limiting the aspect ratio). In one embodiment, a CVD carbon material is deposited to a thickness which is approximately 5 times greater than the feature dimension for an aspect ratio of 5:1. In a further embodiment, the ratio of CVD carbon layer thickness to feature dimension is between 1:1 and 5:1. Such a range of ratios will provide adequate structural integrity so that patterned features will not collapse during subsequent processing. In one such embodiment, where the feature dimension is between 32 nm and 47 nm (45 nm technology node), the CVD carbon layer thickness is between approximately 50 nm and approximately 100 nm.

Figure 5:
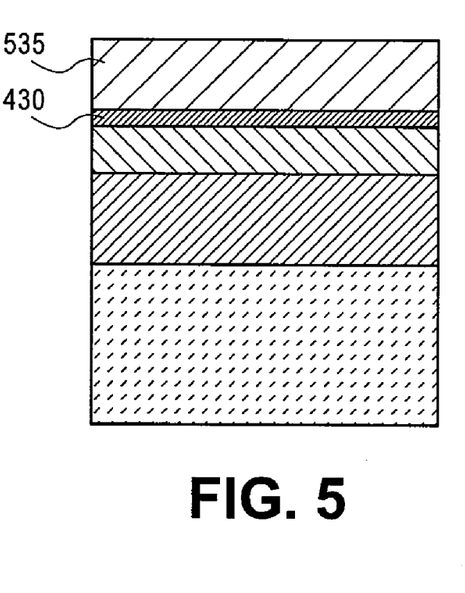

Double exposure method 200 of FIG. 2 proceeds with deposition of any intermediate anit-reflective coating (ARC) layers and photoresist as depicted in FIG. 4 and FIG. 5. In a particular embodiment, a dielectric ARC (DARC) layer 430 is first deposited on the carbonaceous mask layer 425. DARC layer 430 improves adhesion between the carbonaceous mask layer 425 and an overlying layer. The DARC layer 430 may also serve as an etch stop between an overlying layer and the carbonaceous mask layer 425. In certain embodiments, the DARC layer 430 is an inorganic material including silicon nitride, silicon oxide, or silicon oxynitride (SiON) having a thickness dependant on the optical properties of the DARC material composition and the wavelength employed for photolithography. Typically, the DARC layer 430 is between 10 mn and 30 nm and in a particular embodiment, a SiON DARC of approximately 20 nm is employed. In a further embodiment, the DARC layer 430 is deposited as a recipe step performed in a single deposition system in conjunction with the deposition of a CVD carbon as the carbonaceous mask layer 425. In a particular embodiment, the DARC layer 430 is deposited by PECVD with a $SiH_4$ precursor at a temperature greater than 250° C. and preferably greater than 300° C., but less than 500° C. to prevent grain growth in a polysilicon substrate layer 305.

As shown in FIG. 5, BARC layer 535 is applied over carbonaceous mask layer 425 (or on DARC layer 430). BARC layer 535 is an organic material, such as, but not limited to polyamides and polysulfones, which is typically a spun-on. BARC layer 535 reduces reflection of light during patterning of the photosensitive layer and is also useful for thinner photoresist coatings because the BARC layer 535 increases the total thickness of the multi-layered mask for improved etch resistance during etch of underlying substrate layer 305. Generally, BARC layer 535 must have sufficient thickness to extinguish the light used for exposure and typically ranges from 10 nm to more than 90 nm. For one 193 nm lithography embodiment, the thickness is of BARC layer 535 is approximately 80 nm.

Figure 6:
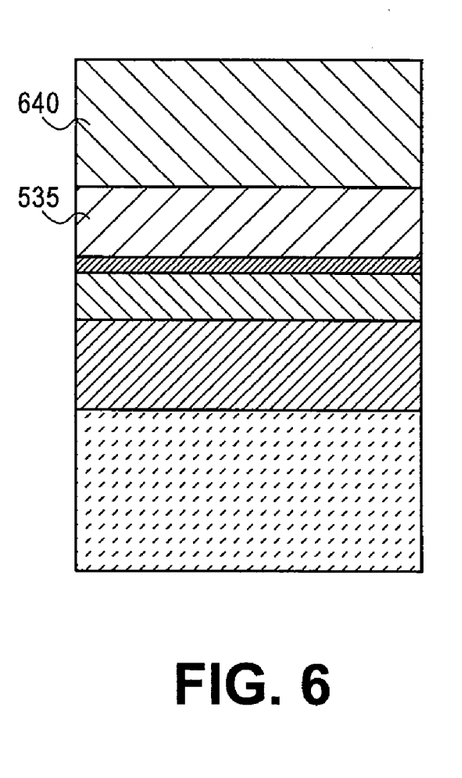

Next, as shown in FIG. 6, a photoresist layer 640 is applied. Generally, any photoresist formulation known in the art may be employed. In a particular embodiment, photoresist layer 640 is formed with a composition typical for 65 nm generation lithography. Photoresist layer 640 may be formed to a range of thicknesses, dependent on the selectivity over the underlying films required. The thickness of the photoresist layer 640 is advantageously minimized to reduce the mechanical stresses present when minimum sized features are subsequently developed. In a particular embodiment designed to produce photoresist features having minimum width dimensions between 32 nm and 47 nm, the photoresist layer 640 is formed to a thickness less than twice that of the BARC layer 535, for example between 100 nm and 150 nm.

Double exposure method 200 then proceeds at operations 225 and 230 with a first alignment and lithographic exposure of the photoresist layer 640, respectively. The alignment operation 225 may be performed by any conventional means to align a reticle 641 with a feature in the substrate layer 305 or substrate 301. For example, a global align as well as a local align of an individual field to be stepped or scanned may be performed, as known in the art. After the first alignment operation 225, the photoresist layer 640 is then patterned a first time at operation 230 with a conventional lithography process, such as one employing 193 nm wavelengths, to define a first pattern of photoresist lines and spaces.

Exposure of operation 230 prints at least a first pair of photoresist lines with a space there between. The printed width of the photoresist line is larger than the printed width of the space. In the particular embodiment depicted in FIG. 7A, the printed width of the photoresist line, $L_1$, is approximately three times larger (3×) than the printed width of the space, S (x). With the larger line size, the printed width of the space, S, may be pushed to the absolute minimum possible with a given lithography tool. Thus, the CD of the space is reduced at the expense of an increased printed width of the photoresist line, $L_1$. For example, in a particular embodiment, a 65 nm generation lithography tool capable of providing a 65 nm half pitch is pushed to print the x-dimension of the space, S, at between about 32 nm and about 47 nm with the width of the photoresist line, $L_1$, relaxed to between about 96 nm and about 140 nm.

Next, double exposure method 200 proceeds at operation 225 with an addition of an alignment offset relative to the first alignment performed. Generally, the alignment offset may be input or provided to the lithography equipment in any manner known in the art. For example, the alignment offset may be input to a scanner controller to cause at least one of a reticle, optical path, or substrate holder (i.e. stage) to have positional offset relative to that of the first exposure of operation 230. As depicted in FIG. 8A, reticle 641 is offset from the position depicted in FIG. 7A by an amount approximately equal to twice the width of the space, S, or 2×. Addition of the 2× offset overlays an opening in the reticle 641 with the photoresist line, L1, printed with the first exposure of operation 230.

Figure 7A:
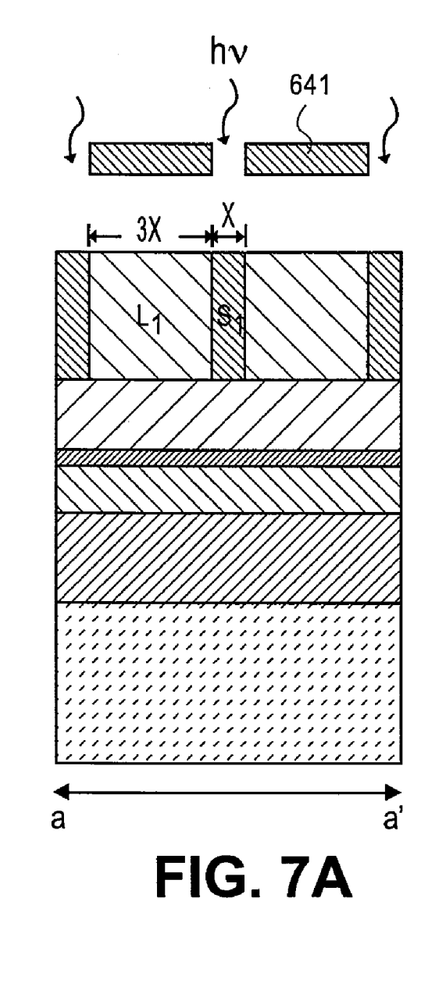
Figure 8A:
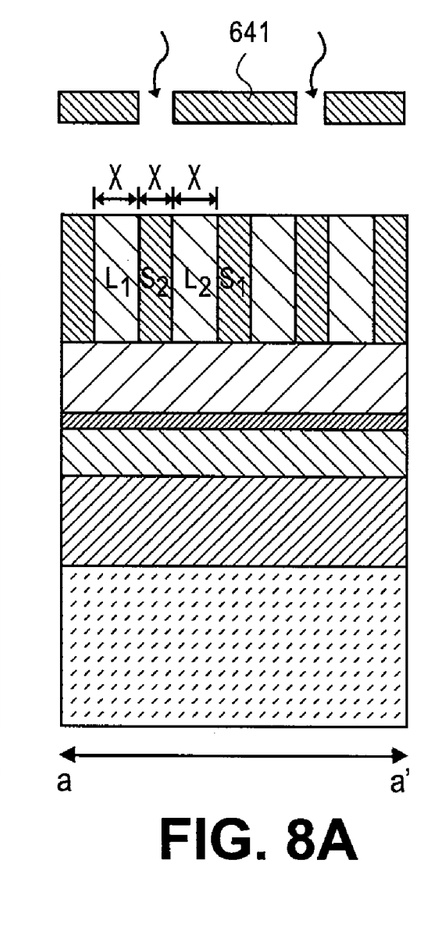

With the offset depicted in FIG. 7A, a second exposure performed during operation 240 re-exposes the photoresist layer 640 to form a pitch-reduced, CD reduced double pattern. The particular offset of 2× bifurcates the first photoresist line $L_1$ into two photoresist lines $L_1$ and $L_2$ having the combined width of 2×. Assuming perfect alignment, the first photoresist line $L_1$ with a width of 3× is bifurcated into two photoresist lines, $L_1$ and $L_2$, each having a width of X, providing for a 1:1 line:space pitch ratio. Thus, for the particular implementation wherein the width of the space, S, is printed by the 65 nm generation lithography tool to between 32 nm and 47 nm, the double exposure method prints a double pattern with a 32 nm to 47 nm half pitch.

In this manner, the reduced CD possible from a lithography tool operated at relaxed pitch requirements may be utilized in combination with a method incorporating the ability of lithography tools to perform fine alignment to produce a double exposed pattern with a half pitch below that possible with a conventional single exposure method. Such a process may therefore advantageously extend the useful life of any particular generation of lithography equipment. For example, 65 nm generation lithography equipment, costing three to four times less than that of 45 nm generation equipment, may be employed with a photoresist double exposure method to produce features of comparable half pitch.

Generally, global (e.g. wafer-level) and/or local (e.g. field-level) alignment may be performed before and/or after addition of the alignment offsets, depending on lithography equipment configuration. Similarly, the first exposure of operation 230 and the second exposure of operation 240 may be performed in succession as two scans of each field, the pair of scans then performed pair wise over each field across the substrate 301. Alternatively, the first exposure may be performed across the entire substrate 301 followed by the second exposure across all fields of the substrate 301. In one preferred implementation, a single global alignment process is employed at operation 225 and then a single local alignment process is performed for each field, followed by the first and second exposure operations of operation 230 and 240. Thus, with one local alignment for both exposure operations, the alignment offset is added to the original alignment values at operation 235. Alternatively, a first scan may be performed over substantially the entire substrate 301 during the first exposure of operation 230 and then the alignment offsets are added at operation 235 followed with a second scan performed over substantially the entire substrate 301 during the second exposure of operation 240. In one such implementation, a first local alignment is performed for each field as part of the first scan and then a second local alignment is performed for each field as part of the second scan with the alignment offset entered after the second local alignment.

Figure 7B:
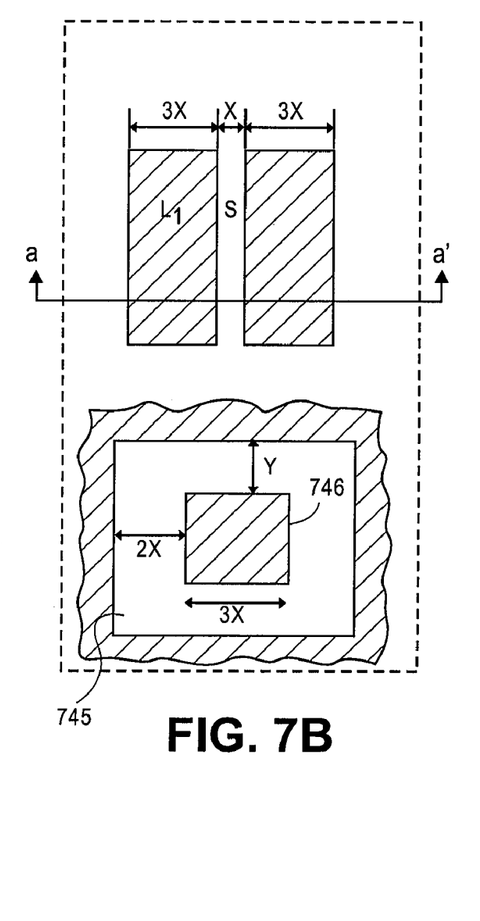
FIGS. 7B, 7C and 8B, 8C illustrate plan views of a workpiece during operations depicted in FIGS. 7A and 8A, respectively, in accordance with one embodiment of the present invention.
Figure 8B:
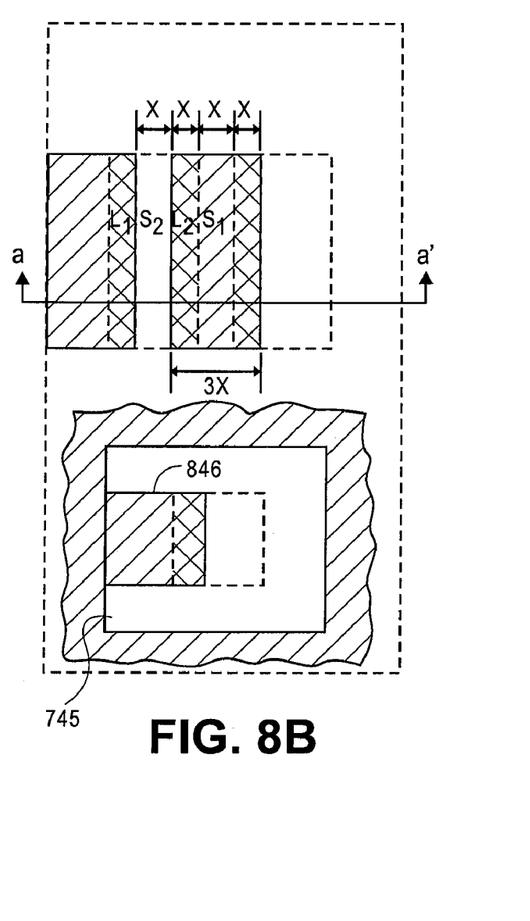

The alignment offset added at operation 235 is further depicted in FIGS. 7B and 8B, which are plan views of the cross-section views of FIGS. 7A and 8A, respectively, as represented by the a-a' line. As visible from the plan view of FIG. 7B, in the particular embodiment depicted, the alignment offset is one-dimensional, for example in the x direction. A box-in-box alignment structure depicts an inner box 746 is aligned at operation 225 to be centered within an outer box 745 a distance 2x from the inner edge of the outer box 745. As depicted in FIG. 8B, an alignment offset equal to approximately 2x places the outer edge of the inner box 846 coincident with the outer edge of the outer box 745. Embodiments incorporating a one-dimensional alignment offset like that depicted in FIGS. 8A and 8B advantageously provide for pitch reduction in one dimension while the layout of the features in the y-direction is not significantly modified from that of a single exposure process. Thus, in one embodiment, a reduced pitch in the gate length dimension may be provided to polysilicon gate electrodes without complicating the gate width dimension with a doubly exposed pattern. In other embodiments, however, the alignment offset may be similarly provided in both an x-dimension and an orthogonal y-dimension for a reticle with a conventional Manhattan layout (orthogonal lines).

Figure 7C:
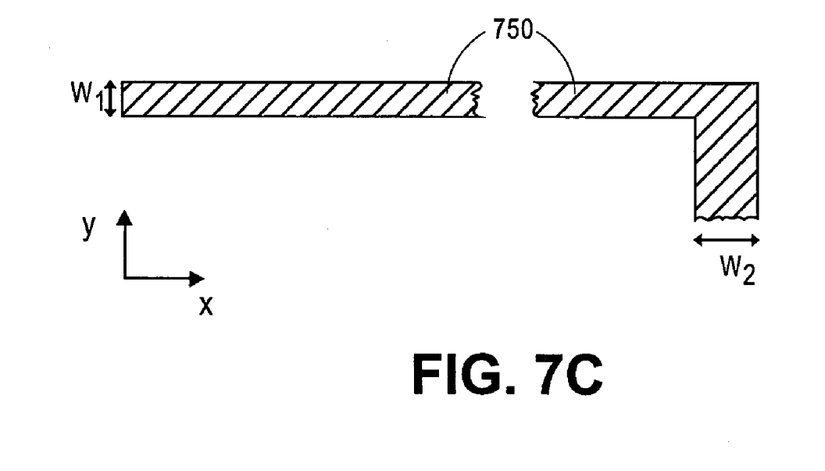
Figure 8C:
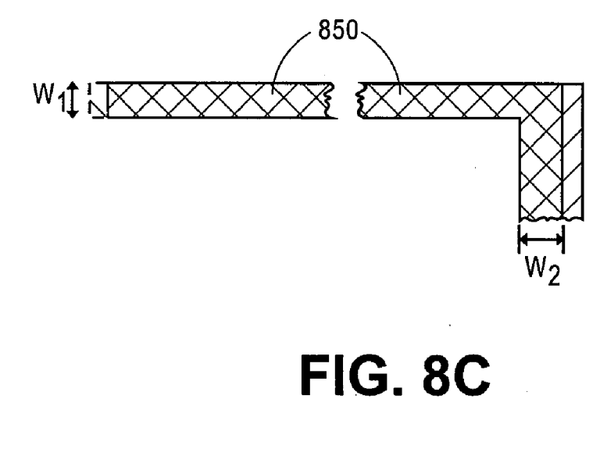

The pitch reduction achieved by the double exposure methods disclosed herein may be applied over substantially and entire field or only a portion thereof. In one embodiment, as further shown in FIGS. 7C and 8C, reticle layout is implemented with consideration of the double exposure method described herein to provide for minimal artifacts and correct dimensionality. As depicted in FIG. 7C, features are designed in a reticle to print a feature during the first exposure of operation 230, such as the line trace 750, with a differential in the line CD between the lengths in the x and y dimensions. The second alignment of the second exposure then trims the feature in the dimension of the offset to provide a final feature with proper dimensionality. Line trace 750, for example, includes a first width in the y-dimension, $W_1$, and a second width in the x-dimension, $W_2$. Where $W_1$ is printed with a size smaller than $W_2$, an alignment offset in the x-dimension causes a pitch reduction at operation 240 in some portions of the field, trimming the width $W_2$ to be approximately equal to $W_1$. This may provide a line trace 850 with approximately uniform widths in both the x-dimension and the y-dimension. Thus, by controlling line and space CD's, a layout may be designed for a double exposure to cause pitch reductions (line splitting) only in certain portions of the field while causing only CD reductions (photoresist line trimming) in other portions of the field.

In another embodiment, only a portion of the field is exposed during the second exposure of operation 240. In one such embodiment, a portion of the reticle is bladed off after the first exposure of the photoresist layer 640 at operation 230 and before the re-exposure of the photoresist layer 640 at operation 240. In another embodiment, the portion of the field scanned during the re-exposure of operation 240 is otherwise limited to be smaller than the portion of the field scanned during the exposure of operation 230.

Furthermore, while the depicted embodiment provides for a double image of the single reticle 641 in the photoresist layer 640, it should be appreciated that the first exposure of operation 230 may employ a first reticle 641 while the second exposure of operation 240 may employ a second reticle (not shown). Implementations with a single reticle may advantageously reduce the alignment requirements as the alignment performed for the first exposure of operation 230 may be utilized in the second exposure of operation 240. However, double imaging may complicate the layout. Implementations exposing a first reticle and then exposing a second reticle, different than the first, enables greater flexibility, such as in the selection of which portions of a field are to be pitch-reduced. However, the separate reticle handling may necessitate an alignment process prior to the second exposure, operation 240, distinct from that performed prior to the first exposure, operation 230. It will be appreciated by one of ordinary skill in the art that a plurality of alignments incurs an overlay penalty which may be avoidable in single reticle, dual-exposure embodiments.

Figure 9:
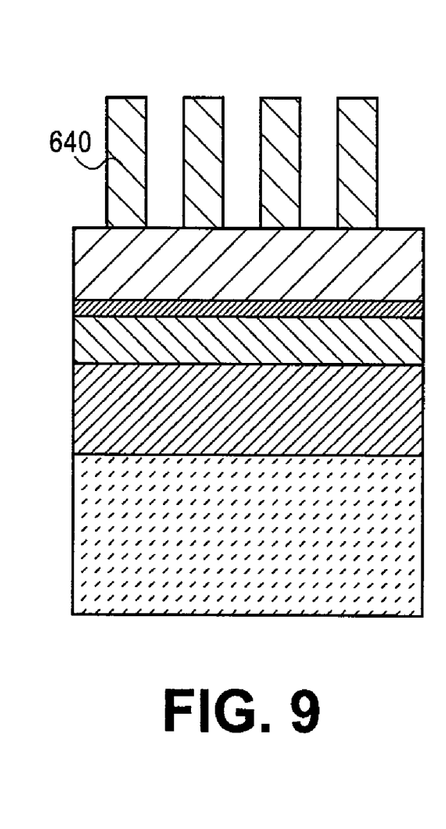
Figure 10:
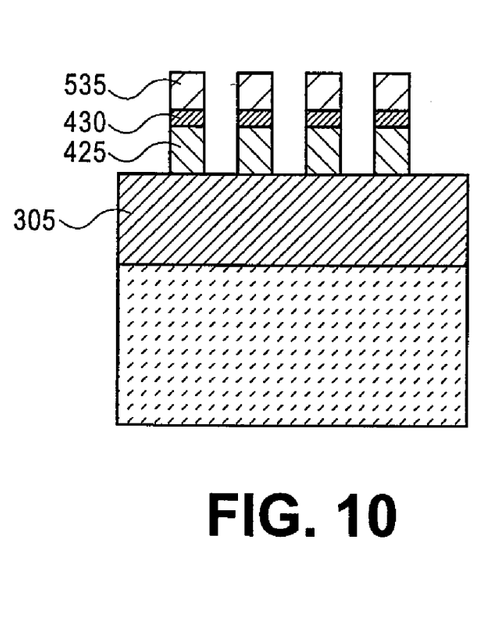
Figure 11:
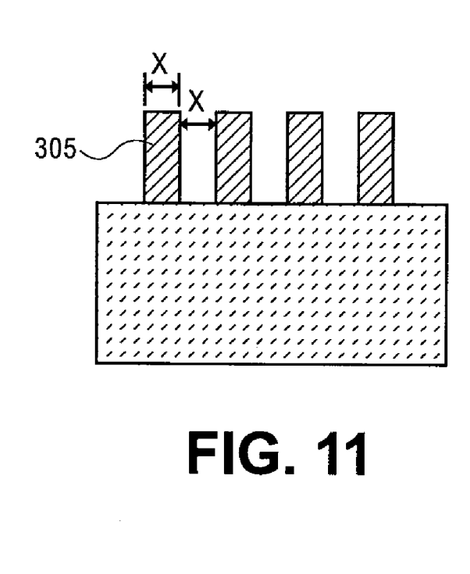

Returning to method 200, the twice-exposed photoresist layer 640 is then developed at operation 245, as depicted in FIG. 9, with any conventional develop process. Following develop, the carbonaceous mask layer 425 is then defined with an etch process along with any intermediate layers, such as BARC layer 535 and DARC layer 430, as depicted in FIG. 10. For embodiments where a 1:1 pitch ratio is achieved with the first and second exposure operations, pattern etching of the carbonaceous mask layer 425, DARC layer 430 and BARC layer 535 is performed with an anisotropic etch process to maintain the pitch ratio between lines and spaces achieved by the lithographic operations. In a specific embodiment, where carbonaceous mask layer 425 is comprised of a CVD carbon film, an anisotropic plasma etch employs gases such as oxygen ($O_2$) and $N_2$ and other nitrogen oxides and $CH_4$. These etch chemistries provide good pattern fidelity and has been found to produce sidewalls in the CVD carbon with a LER less than that in a masking photoresist layer. In an exemplary embodiment, wherein the BARC layer 535 is at least half a thick as the photoresist layer 640 (e.g. BARC layer 535 is approximately 75 nm and photoresist layer 640 is approximately 140 nm) and the carbonaceous mask layer 425 is at least half as thick as the BARC layer 535 (e.g. CVD carbon layer is approximately 50 nm), etching the carbonaceous mask layer 425 removes substantially all of the photoresist layer 640. In a further embodiment, a conventional etch processes for the DARC layer 430 and BARC layer 535 is coupled with a CVD carbon etch to provide a pitch-reduced, CD-reduced double pattern over the substrate layer 305. Conventional anisotropic etch process may then be employed to form a pitch-reduced, CD-reduced double pattern in the substrate layer 305, as shown in FIG. 11.

Figure 12:
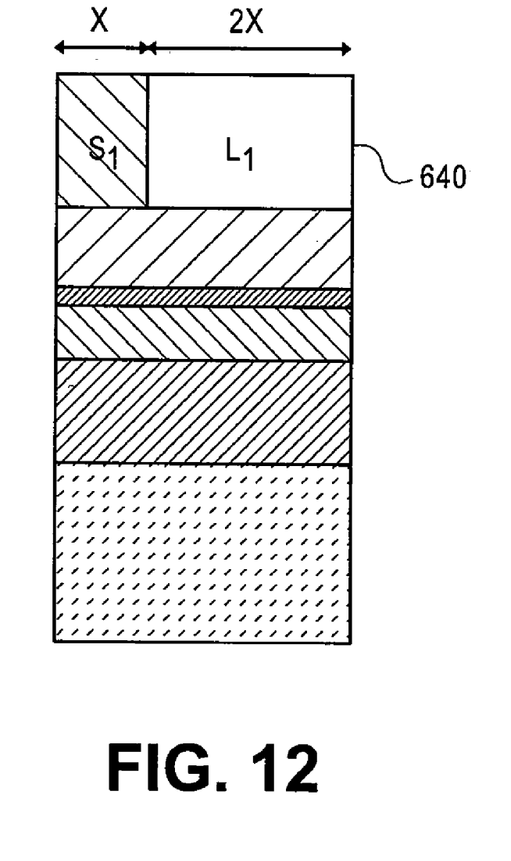
FIGS. 12, 13, 14, 15 and 16 illustrate cross sectional views of a workpiece during representative operations of a double exposure method for etching a double pattern in a substrate layer, in accordance with one embodiment of the present invention.
Figure 13:
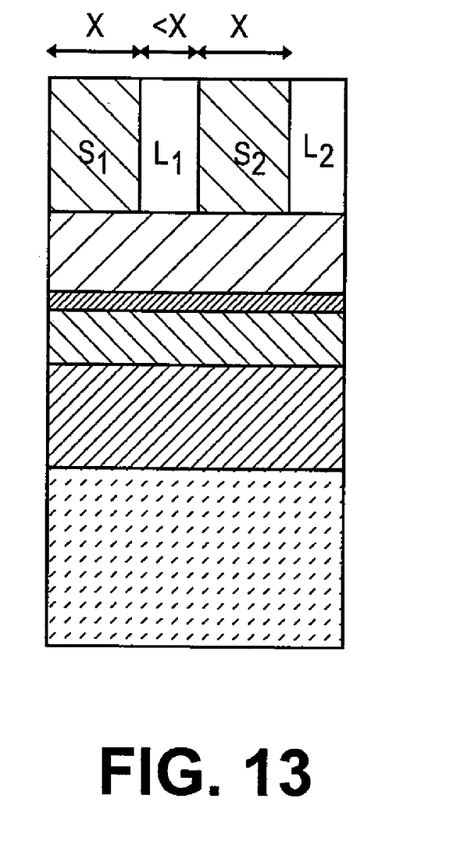
Figure 14:
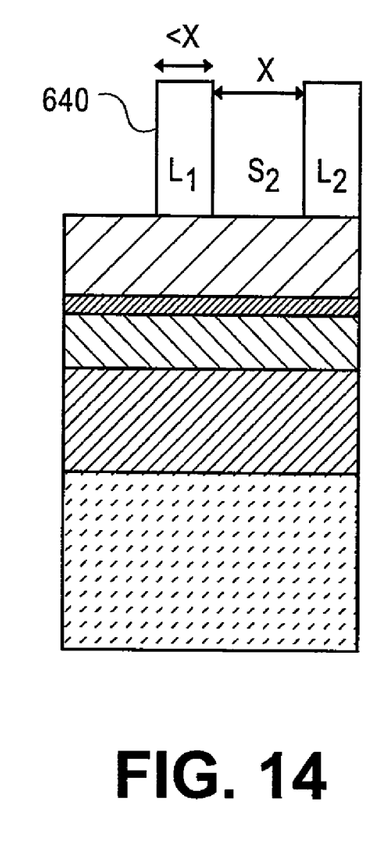

In an alternative embodiment where a 1:1 pitch ratio is not achieved with the first and second exposure operations, pattern etching of any of the carbonaceous mask layer 425, DARC layer 430 or BARC layer 535 may be performed with an etch process having significant negative or positive etch bias to modify the pitch ratio between lines and spaces achieved by the lithographic operations. In some exemplary embodiments, the CD of the photoresist line printed during the first exposure of operation 230 is not at least three times that of the space, but rather between about 1.5 and 2.5 times the CD of the space. As depicted in FIG. 12, line $L_1$ is approximately twice the width of space $S_1$. Then, an alignment offset of approximately 1.25× results in a double exposure pattern depicted in FIG. 13 and FIG. 14 wherein the CD of the spaces, $S_1$ and $S_2$, is larger than that of the lines $L_1$ and $L_2$. Such an embodiment is possible where the minimum alignment offset is less than a multiple of the minimum printable space. In an embodiment, a polymerizing etch process may be employed to pattern the BARC layer 535 to increase the line CD of the carbonaceous layer and/or reduce the CD of the space in the carbonaceous layer (i.e. CD shrink).

Figure 15:
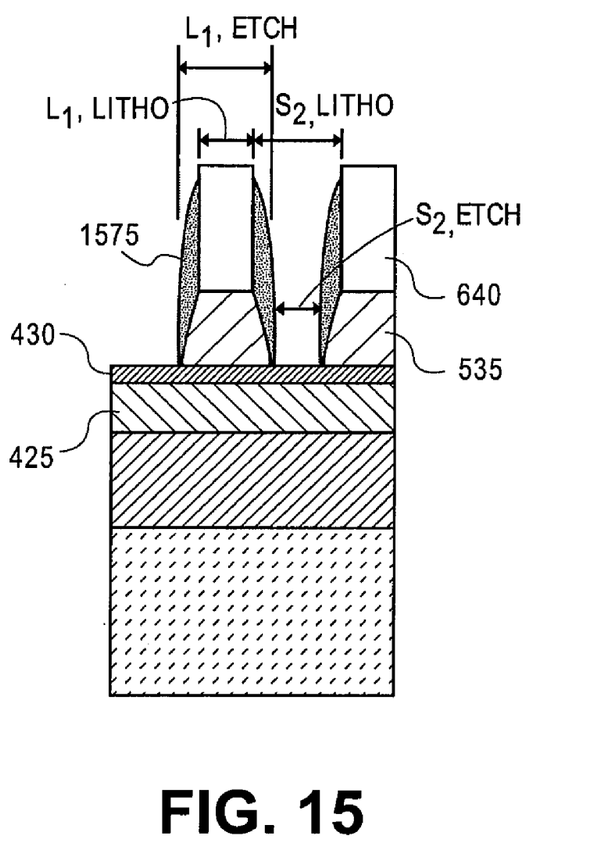

In one embodiment, the BARC etch process conditions are selected to deposit polymer 1575 on the sidewalls of photoresist layer 640 to shrink the lithographically defined space, $S_{2, litho}$ to the desired CD, $S_{2, etch}$. The delta of $S_{2,litho}$ minus $S_{2,etch}$ is referred to as etch bias and is therefore a negative number when the CD of the space, $S_{2, etch}$ is smaller than $S_{2,litho}$. In a particular embodiment, because the BARC layer 535 is relatively thin, typically less than 1000 Å, a highly polymerizing process condition is utilized to achieve a significant etch bias during the BARC etch. For the same reason, a relatively large amount of sidewall polymer may be deposited during the BARC etch without causing an appreciable amount of sidewall taper in an underlying layer subsequently etched. Additionally, during the BARC etch, the aspect ratio is still relatively low, mitigating process concerns such as etch stop. In an embodiment, the plasma etch process employed at BARC etch of operation 250 of FIG. 2 comprises a polymerizing process gas, such as $CHF_3$, capable of generating $CF_2$ species and a non-polymerizing process gas, such as $CF_4$. In an exemplary implementation employing $CHF_3$ at a flow rate of between 5 sccm and 50 sccm, $CF_4$ is introduced into the etch chamber at a flow rate sufficient to provide a $CF_4$:$CHF_3$ ratio of between 0.3:1 and 1.5:1. The BARC etch may additionally include a carrier gas, which may further serve a role in sidewall polymer formation. In an embodiment, the carrier gas is nitrogen ($N_2$) having a flow rate relative to the polymerizing process gas of between 0.3 and 1.0. In an embodiment, BARC etch of operation 250 is preformed at a low process pressure to increase the magnitude of etch bias. In an embodiment, the process pressure is less than 25 milliTorr (mT). In a particular embodiment, the pressure is approximately 10 mT. In an embodiment, the high frequency source delivers a power between 200 and 400 watts (W), normalized to a etch chamber having an electrode approximately 300 mm in diameter (e.g. an etch tool adapted for 300 mm semiconductor wafers). In a further embodiment a low frequency bias power, operating at a frequency between 2 and 60 MHz provides between 100 W and 400 W of additional power to the plasma. To retain substantially all of the CD shrink from the polymerizing BARC etch, the carbonaceous mask layer 425 of FIG. 15 is etched with a commonly known amorphous carbon etch process comprising an alkane, alkene, or alkyne. In on such embodiment, the etchant includes a hydrocarbon having at least two carbons, such as $C_2H_6$. In a specific embodiment, where carbonaceous mask layer 425 is comprised of a CVD carbon film, an anisotropic plasma etch employs gases such as oxygen ($O_2$) and $N_2$ and other nitrogen oxides and $CH_4$.

Figure 16:
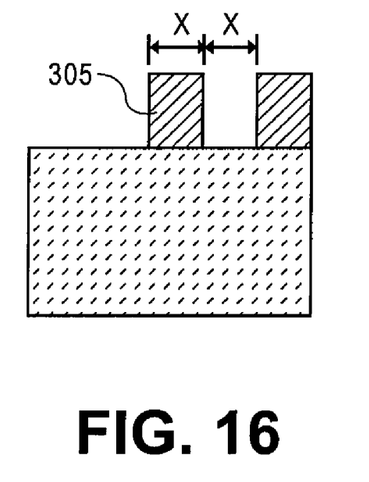

With the etch bias implemented, either with the BARC layer etch described above or with by an alternate means, a pitch reduced, CD reduced double pattern is then etched into the substrate layer 305, as depicted in FIG. 16. In one such embodiment, the etch bias provided in operation 250 of FIG. 2 provides a double pattern with an approximately 1:1 line: space ratio with a half pitch of between 32 nm and 47 nm from 65 nm generation lithography performing the double exposure methods described herein. Thus, the double exposure method facilitates formation of a high fidelity pattern having a reduced half pitch and reduced critical dimension with minimal processing overhead.

In an embodiment of the present invention, the lithographic imaging equipment employed at operations 225, 230, 235 and 240 is computer controlled to control the reticle to substrate alignment, as well as other process parameters. The computer controller may be one of any form of general-purpose data processing system that can be used in an industrial setting for controlling the various subprocessors and subcontrollers. Generally, the computer controller includes a central processing unit (CPU) in communication with memory and input/ output (I/O) circuitry, among other common components. Software commands executed by the CPU, cause the system to perform a method comprising: providing a substrate layer under a photoresist; exposing the photoresist to form a first pair of lines with a first space there between, the first pair of lines having a first alignment relative to the substrate layer; offsetting the first alignment to have a second alignment and re-exposing the photoresist to bifurcate at least one of the first pair of photoresist lines with a second space to form a pitch-reduced, CD reduced double pattern comprising at least two photoresist lines and two spaces.

Portions of the present invention may also be provided as a computer program product, which may include a computer-readable medium having stored thereon instructions, which when executed by a computer (or other electronic devices), cause a hardware system to perform a method comprising: providing a substrate layer under a photoresist; exposing the photoresist to form a first pair of lines with a first space there between, the first pair of lines having a first alignment relative to the substrate layer; offsetting the first alignment to have a second alignment and re-exposing the photoresist to bifurcate at least one of the first pair of photoresist lines with a second space to form a pitch-reduced, CD reduced double pattern comprising at least two photoresist lines and two spaces. The computer-readable medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other commonly known type computer-readable medium suitable for storing electronic instructions. Moreover, the present invention may also be downloaded as a computer program product, wherein the program may be transferred from a remote computer to a requesting computer over a wire.

Although the present invention has been described in language specific to structural features and/or methodological acts, it is to be understood that the invention defined in the appended claims is not necessarily limited to the specific features or acts described. The specific features and acts disclosed are to be understood as particularly graceful implementations of the claimed invention in an effort to illustrate rather than limit the present invention.

What is claimed is:

1. A double exposure patterning method comprising:
   providing a substrate comprising a substrate layer under a photoresist layer;
   aligning, in a photolithography tool, a reticle to a feature in the substrate or substrate layer;
   exposing the photoresist layer to form a first pair of photoresist lines with a first critical dimension (CD) in a first dimension and with a first space there between, the first pair of photoresist lines having a first alignment relative to the substrate layer, and wherein the exposing further prints a third photoresist line having a third CD in the first dimension;
   offsetting the first alignment to have a second alignment by providing to the photolithography tool a predetermined positional offset relative to a position during the exposing, wherein the offsetting is in the first dimension, but not in a second dimension;
   re-exposing the photoresist layer with the reticle to bifurcate at least one of the first pair of photoresist lines with a second space to form a pitch-reduced, critical dimension (CD) reduced double pattern comprising at least two photoresist lines and two spaces, and wherein the re-exposing trims the third photoresist line to reduce the third CD without bifurcating the third photoresist line; and
   etching the substrate layer to have the pitch-reduced, CD reduced, double pattern.

2. The method of claim 1, wherein the first space has a CD of X, each of the first pair of photoresist lines has a CD of approximately 3×, wherein the second alignment is offset from the first alignment by approximately 2× and wherein re-exposing the photoresist forms a double pattern of photoresist lines with a CD of X and spaces with a CD of X, and the third CD is reduced by 2×.

3. The method of claim 2, wherein X is approximately 32 nm and wherein the exposing and re-exposing of the photoresist layer is performed with a 65 nm lithographic scanner.

4. The method of claim 3, further comprising:
   blading off a portion of a reticle after the exposure of the photo-resist layer and before the re-exposure of the photoresist layer.

5. The method of claim 3, further comprising:
   scanning a first portion of the reticle to expose the photoresist layer; and
   scanning a second portion, less than the first portion, to re-expose the photoresist layer and form a CD-reduced, pitch-reduce pattern corresponding to only a portion of the reticle.

6. The method of claim 1, wherein a CVD carbon layer is between the substrate layer and the photoresist layer and wherein the CVD carbon layer is etched to have the pitch-reduced, CD-reduced double pattern.

7. The method of claim 6, wherein the pitch-reduced, CD-reduced double pattern in the photoresist layer has a first line edge roughness (LER) and wherein the pitch-reduced, CD-reduced double pattern in the CVD carbon layer has a second LER, less than the first LER.

8. The method of claim 1, wherein the exposing prints a first portion of the third line with the third CD in the first dimension, and prints a second portion of the third line with a fourth CD in the second dimension, orthogonal to the first dimension, the third CD printed to be greater than the fourth CD and wherein the re-exposing reduces the third CD to be approximately equal to the fourth CD.

* * * * *